(12) United States Patent
Kim et al.

(10) Patent No.: US 9,078,334 B2
(45) Date of Patent: Jul. 7, 2015

(54) EXTREME ULTRAVIOLET LIGHT SOURCE DEVICES

(71) Applicant: Samsung Electronics Co., Ltd., Suwon-si (KR)

(72) Inventors: Hoyeon Kim, Seoul (KR); Insung Kim, Seongnam-si (KR); Jinho Jeon, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/105,654

(22) Filed: Dec. 13, 2013

(65) Prior Publication Data

US 2014/0319387 A1    Oct. 30, 2014

(30) Foreign Application Priority Data

Apr. 26, 2013 (KR) .......................... 10-2013-0046787

(51) Int. Cl.
*H05G 2/00* (2006.01)
*G03F 7/20* (2006.01)

(52) U.S. Cl.
CPC ................ *H05G 2/006* (2013.01); *H05G 2/008* (2013.01); *G03F 7/70916* (2013.01)

(58) Field of Classification Search
CPC ....... H05G 2/003; H05G 2/006; H05G 2/008; G03F 7/70916
USPC ..................................................... 250/504 R
See application file for complete search history.

(56) References Cited

U.S. PATENT DOCUMENTS

| | | | |
|---|---|---|---|
| 3,627,191 A | 12/1971 | Hood, Jr. | |
| 4,663,567 A * | 5/1987 | Wong | 315/111.21 |
| 6,469,310 B1 * | 10/2002 | Fiedorowicz et al. | 250/492.22 |
| 6,493,423 B1 * | 12/2002 | Bisschops | 378/119 |
| 6,661,018 B1 * | 12/2003 | McGregor et al. | 250/504 R |
| 6,683,936 B2 | 1/2004 | Jonkers | |
| 6,738,452 B2 * | 5/2004 | McGregor et al. | 378/119 |
| 7,372,057 B2 * | 5/2008 | Gaebel et al. | 250/504 R |
| 7,405,416 B2 * | 7/2008 | Algots et al. | 250/493.1 |
| 7,439,530 B2 | 10/2008 | Ershov et al. | |
| 7,491,954 B2 | 2/2009 | Bykanov et al. | |
| 7,838,854 B2 * | 11/2010 | Algots et al. | 250/504 R |
| 7,872,245 B2 * | 1/2011 | Vaschenko et al. | 250/492.2 |
| 8,017,924 B2 | 9/2011 | Bykanov et al. | |
| 8,263,953 B2 * | 9/2012 | Fomenkov et al. | 250/504 R |
| 8,507,882 B2 * | 8/2013 | Swinkels et al. | 250/504 R |

(Continued)

FOREIGN PATENT DOCUMENTS

| | | |
|---|---|---|
| JP | 2007207574 | 8/2007 |
| JP | 2007005124 | 11/2007 |

(Continued)

*Primary Examiner* — Michael Logie
*Assistant Examiner* — Wyatt Stoffa
(74) *Attorney, Agent, or Firm* — Onello & Mello, LLP.

(57) ABSTRACT

An extreme ultraviolet light (EUL) source device is disclosed, the device comprising: a chamber in which a gas flow and a droplet stream are provided; a droplet generator through which target material is changed into the droplet stream; and a shroud positioned along the droplet stream, the shroud shielding the droplet stream from the gas flow, wherein the droplet stream is irradiated by laser to produce plasma and generate an extreme ultraviolet light. The shroud includes flow guide surface features that guide accumulated target material away from a collector mirror that reflects and focuses the EUL.

17 Claims, 14 Drawing Sheets

(56) References Cited

U.S. PATENT DOCUMENTS

| | | | |
|---|---|---|---|
| 2001/0006217 A1* | 7/2001 | Bisschops | 250/493.1 |
| 2002/0162974 A1* | 11/2002 | Orsini et al. | 250/504 R |
| 2002/0163793 A1 | 11/2002 | Jonkers | |
| 2003/0223546 A1* | 12/2003 | McGregor et al. | 378/143 |
| 2004/0179182 A1 | 9/2004 | Bakker | |
| 2006/0192154 A1* | 8/2006 | Algots et al. | 250/504 R |
| 2007/0023706 A1* | 2/2007 | Sjmaenok et al. | 250/504 R |
| 2007/0170377 A1* | 7/2007 | Nakano | 250/504 R |
| 2008/0067454 A1 | 3/2008 | Wassink | |
| 2008/0067456 A1* | 3/2008 | Kloepfel et al. | 250/504 R |
| 2008/0087847 A1 | 4/2008 | Bykanov et al. | |
| 2008/0218709 A1 | 9/2008 | Van Vliet et al. | |
| 2009/0057567 A1 | 3/2009 | Bykanov et al. | |
| 2009/0230326 A1* | 9/2009 | Vaschenko et al. | 250/492.2 |
| 2009/0267005 A1 | 10/2009 | Bykanov et al. | |
| 2010/0181498 A1* | 7/2010 | Someya et al. | 250/492.1 |
| 2010/0258748 A1* | 10/2010 | Vaschenko et al. | 250/504 R |
| 2011/0248191 A1* | 10/2011 | Fomenkov et al. | 250/504 R |
| 2012/0205559 A1* | 8/2012 | Yabu et al. | 250/504 R |
| 2012/0280149 A1* | 11/2012 | Mestrom et al. | 250/492.1 |
| 2013/0186430 A1 | 7/2013 | Ehm et al. | |

FOREIGN PATENT DOCUMENTS

| | | |
|---|---|---|
| JP | 2010520635 | 6/2010 |
| JP | 2011181935 | 9/2011 |
| KR | 2003076238 | 9/2003 |
| KR | 2004056374 | 6/2004 |
| KR | 2009007441 | 1/2009 |
| KR | 2009085600 | 7/2009 |
| KR | 2010057851 | 1/2010 |
| KR | 2010057037 | 5/2010 |
| KR | 2010098515 | 9/2010 |

* cited by examiner

EXTREME ULTRAVIOLET LIGHT SOURCE DEVICES

CROSS-REFERENCE TO RELATED APPLICATIONS

This U.S. nonprovisional patent application claims priority under 35 U.S.C. §119 of Korean Patent Application 10-2013-0046787 filed on Apr. 26, 2013, the entire contents of which are hereby incorporated by reference.

BACKGROUND

The present inventive concept relates to photolithography apparatus and, more particularly, to extreme ultraviolet light source devices which may be used in conjunction with photolithography apparatus and processes.

A photolithography process is used, for example, to form a semiconductor device on a wafer. In producing fine features on wafers, extreme ultraviolet light (EUV) is advantageously adopted as a light source in photolithography apparatus. The EUV can be generated by a laser-produced-plasma (LPP) apparatus and method disclosed in U.S. Publication No. 2011/0248191. However, with the use of this LPP apparatus, contamination of the collector mirror with target material or byproducts thereof is frequently observed. Therefore, there is a need to improve the LPP apparatus and method to reduce or prevent such contamination which impairs the efficiency and useful life of the apparatus.

SUMMARY

Embodiments of the present inventive concept provide an extreme ultraviolet light source device having a flow guide that allows target material to be guided away from the collector mirror.

Embodiments of the present inventive concept provide an extreme ultraviolet light source device having a shroud capable of absorbing target material.

Embodiments of the present inventive concept provide an extreme ultraviolet light source device capable of monitoring target material accumulated on the shroud.

According to exemplary embodiments of the present inventive concepts, an extreme ultraviolet light source device may comprise a chamber in which both a gas flow and a droplet stream are provided. The droplet stream may be irradiated in the chamber by laser to produce plasma generating an extreme ultraviolet light. A droplet generator provides target material to the chamber in the form of the droplet stream. A shroud is positioned along the path of the droplet stream to shield at least a portion of the droplet stream from the gas flow. The shroud may include a flow guide that allows the target material to flow.

In some embodiments, the shroud may be coupled to the droplet generator, and the flow guide may be elongated either toward the droplet generator or in a gravity direction, thereby the target material may move along the flow guide either toward the droplet generator or in the gravity direction.

In some embodiments, the flow guide may extend either in a substantially linear direction or in a spiral along a length of the shroud.

In some embodiments, the shroud may include a "U"-shaped cross-section having a closed side that shields part of the droplet stream from the gas flow and an open side located opposite from the closed side.

In some embodiments, the shroud may include a first end coupled to the droplet generator and a second end opposite from the first end, and an open side of the shroud may have the same size along its length or a varying size that tapers down from the first end to the second end.

In some embodiments, the device may further comprise a container coupled to a first end of the shroud. The container may receive the target material coming along the flow guide.

In some embodiments, the flow guide may be provided on an inner surface of the shroud.

In some embodiments, the device may further comprise a catcher positioned along the droplet stream and configured to gather the target material.

In some embodiments, the device may further comprise a second shroud coupled to a catcher and positioned along the droplet stream. The second shroud may include a second flow guide elongated either toward the droplet catcher or in a gravity direction, thereby the target material may move along the second flow guide either toward the droplet catcher or in the gravity direction.

In some embodiments, the device may further comprise a second container coupled to a second shroud having a second flow guide. The second container may receive the target material coming along the second flow guide.

According to exemplary embodiments of the present inventive concepts, an extreme ultraviolet light source device may comprise: a chamber having a collector mirror provided therein, whereby the collector mirror receives and reflects an extreme ultraviolet light; a droplet generator configured to provide the chamber with a droplet stream of target material; a gas source configured to provide a gas flow to intersect the droplet stream; a laser system configured to produce a laser beam directed at the target material to generate plasma and the extreme ultraviolet light; and at least a first shroud coupled to the droplet generator and elongated along the droplet stream, the first shroud shielding at least a portion of the droplet stream. The first shroud may include a first flow guide that allows the target material to flow into the droplet generator.

In some embodiments, the device may further comprise a second shroud coupled to a droplet catcher. The second shroud may include a second flow guide that allows the target material to flow into the catcher.

In some embodiments, at least one of the first and second shrouds may include a "U"-shaped cross-section having a closed side that shields the droplet stream from the gas flow and an open side located opposite from the closed side. The open side may have a size that tapers along its length down from one end to an opposite end of the shroud.

In some embodiments, the device may further comprise at least one of a piezoelectric transducer and a strain gauge coupled to at least one of the first and second shrouds.

In some embodiments, the device may further comprise a heat insulator interposed between at least one of the first and second shrouds and at least one of the piezoelectric transducer and the strain gauge.

According to exemplary embodiments of the present inventive concepts, an extreme ultraviolet light (EUL) source apparatus comprises: a plasma-generation chamber containing a collector mirror to reflect and focus EUL; a source of a stream of droplets of a target material that traverses the chamber along a droplet path; a source of a laser beam that traverses the chamber along a laser path that intersects the droplet path at an intersection location; a source of a gas flow into, through and out of the chamber; and at least a shroud that shields a portion of the stream of droplets from the gas flow and which includes surface features that inhibit accumulations of target material on shroud surfaces.

In some embodiments, droplets along the droplet path are shielded from the gas flow both before and after the intersection point.

In some embodiments, the droplet path is shielded by the shroud from the gas flow along an upstream side relative to the gas flow direction, but is not shielded along a downstream side.

In some embodiments, the shroud includes surface features along one or both of its inner and outer surfaces that either absorb target material that may contact those surfaces and/or that are configured to guide that target material away from the intersection point.

In some embodiments, the surface features of the shroud comprise grooves and/or ridges that provide longitudinal channels along the surface(s) of the shroud.

BRIEF DESCRIPTION OF THE DRAWINGS

The foregoing and other features and advantages of exemplary embodiments of inventive concepts will be apparent from the more particular description of non-limiting embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION OF PREFERRED EMBODIMENTS

Figure 1:
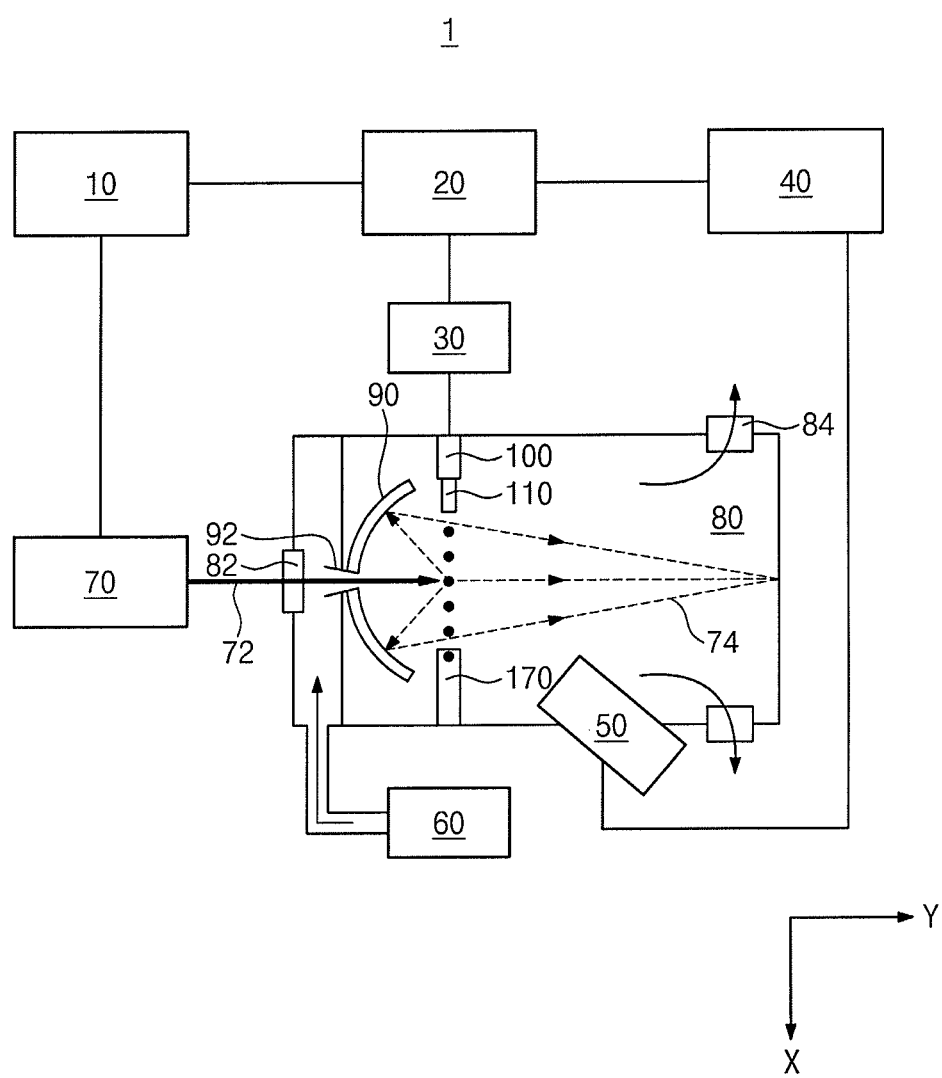
FIG. 1 is a schematic view illustrating the various major component parts of an extreme ultraviolet light source device according to exemplary embodiments of the present inventive concepts.

Exemplary embodiments of inventive concepts will now be described more fully hereinafter with reference to the accompanying drawings, in which some exemplary embodiments of inventive concepts are shown. Exemplary embodiments, may, however, be embodied in many different forms and should not be construed as being limited to the embodiments set forth herein. Rather, these exemplary embodiments are provided so that this disclosure will be thorough and complete, and will fully convey the scope of exemplary embodiments of inventive concepts to those of ordinary skill in the art. In the drawings, the thicknesses of layers and regions are exaggerated for clarity. Like reference numerals in the drawings denote like elements. Hereinafter, this application will describe exemplary embodiments of the present invention in conjunction with the accompanying drawings.

FIG. 1 is a schematic view illustrating components of an extreme ultraviolet light source device according to exemplary embodiments of the present inventive concepts.

Referring to FIG. 1, device 1 is an embodiment of an extreme ultraviolet light source that produces an extreme ultraviolet light using a laser-produced-plasma (LPP) method. For example, device 1 may apply a laser beam to a target material to produce plasma and to provide an exposure apparatus (e.g., a stepper or a scanner) with an extreme ultraviolet light generated from the plasma.

The device 1 may comprise: a chamber 80 configured to accommodate a collector mirror 90 and having an inlet aperture 92 and wherein an extreme ultraviolet light 74 is produced from a laser-produced plasma; a droplet generator 100 configured to provide the chamber 80 with a stream of droplets (designated as black points in FIG. 1) of a target material; a droplet catcher 170 configured to receive any droplets that are not used for the creation of plasma; and a laser system 70 configured to generate a laser beam 72 (e.g., a $CO_2$ laser) that is delivered to the chamber 80 through a window 82.

The target material may comprise Sn, Li, Ti, Xe or any combination thereof. For example, the target material may comprise pure Sn, an Sn compound (e.g., $SnBra_4$, $SnBr_2$, SnH), an Sn alloy (e.g., Sn—Ga, Sn—In, Sn—In—Ga), or any combination thereof. The droplets may stream substantially along an X-axis direction (as denoted in FIG. 1) from the droplet generator 100 toward the droplet catcher 170. The chamber 80 may be maintained in a high vacuum state of less than about 1 Torr. The collector mirror 90 may have a reflective surface which receives EUV light produced by the plasma and then focuses and reflects that EUV light as EUV light 74.

The device 1 may further comprise a gas source 60 configured to provide the chamber 80 with $H_2$, hydrogen radical, He, Ar, HBr, HCl or any combination thereof. A gas from the gas source 60 may be provided to the chamber 80 through the inlet aperture 92 and exhausted from the chamber 80 through an exit port 84. Providing such a gas flow (designated as a solid line arrow) into, through and out of chamber 80 may prevent the collector mirror 90 from becoming contaminated, for example with target material or other materials. The gas may flow through chamber 80 substantially in a Y-axis direction (as denoted in FIG. 1), which is the same axis along which the EUV light 74 is converged by mirror 90.

The device 1 may further comprise: an ignition control system 10 configured to trigger a laser source in the laser system 70; a droplet imager 50 configured to provide a feedback system 40 with an output indicative of the position and/or timing of a droplet of target material; and an EUV controller 20 configured to control the laser system 70 for changing a trajectory and/or focus power of the laser beam 72 based on the detection of a droplet position error delivered from the feedback system 40.

The droplet generator 100 may be provided with a shroud 110 made of metal (e.g., Mo, Cu, stainless steel). In some embodiments, the shroud 110 may be configured to guide a stream of target material or to absorb the target material, as described later.

Figure 2:
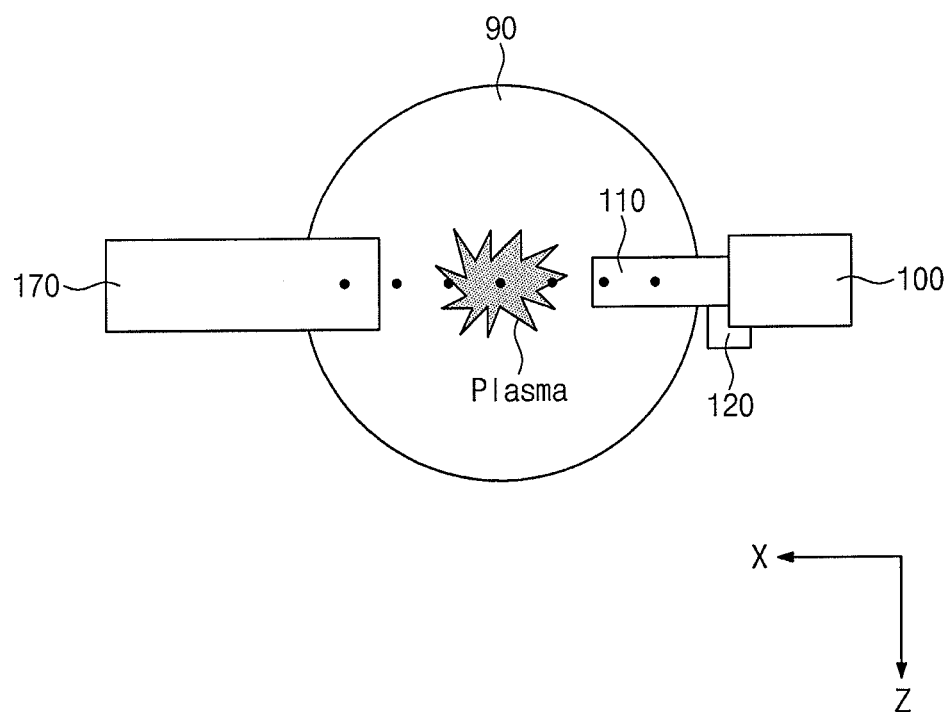
FIG. 2 is a schematic side view illustrating a portion of an extreme ultraviolet light source device according to exemplary embodiments of the present inventive concepts.

FIG. 2 is a schematic side view illustrating a portion of an extreme ultraviolet light source device according to exemplary embodiments of the present inventive concepts.

Referring to FIGS. 1 and 2, the droplet generator 100 may provide the chamber 80 with a droplet stream that intersects the path of the laser beam 72 to produce the plasma by the interaction of the laser and a droplet of target material. The droplet catcher 170 may receive droplets that are not used for the creation of the plasma. For example, the droplets may flow horizontally (i.e., in the X-axis direction as denoted in FIG. 2) perpendicular to a direction of gravity (i.e., the Z-axis direction). Alternatively, the droplet generator 100 may be positioned to move the droplets upward or downward along the direction of gravity (i.e., along the Z-axis direction). Alternatively, for some embodiments, the droplet generator 100 may be positioned to move the droplets obliquely with respect to the X-axis or the Z-axis directions.

When the plasma is produced from a droplet of target material, portions of the droplet or its byproducts may accumulate on the surface of collector mirror 90. To prevent such contamination of the collector mirror 90, the gas source 60 may provide the chamber 80 with a gas flow in the Y-axis direction (as denoted in FIG. 1). The droplet generator 100 may be provided with the shroud 110 which shields a portion of the droplet stream from the gas flow.

In some embodiments, the shroud 110 may be provided with a container 120 for receiving and storing target material that may accumulate on the shroud 110. The shroud 110 may be configured to guide accumulated target material away from collector mirror 90 and to the container 120. Alternatively, the shroud 110 may be configured to absorb the accumulated target material.

Figure 3A:
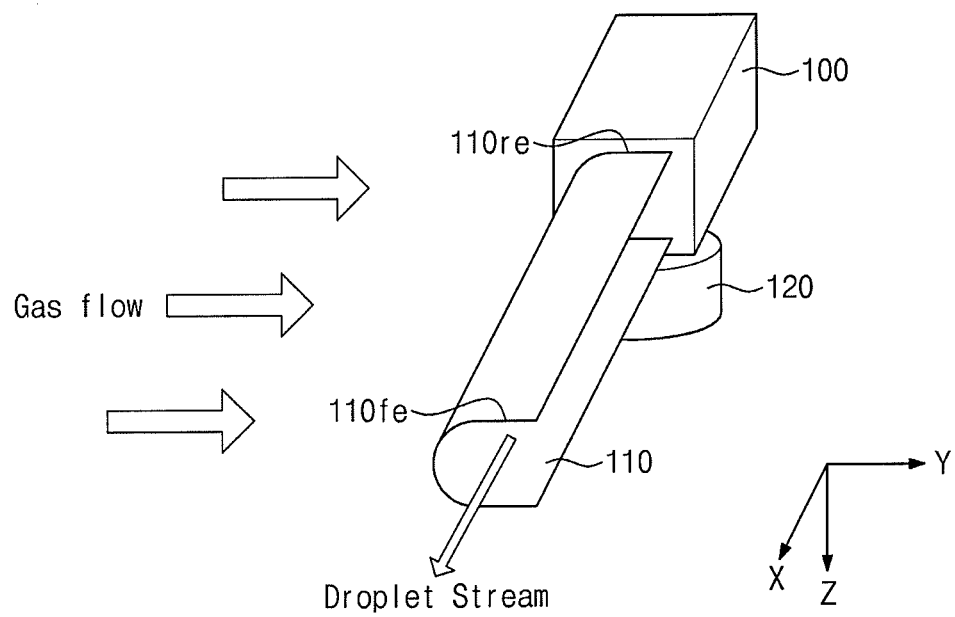
FIG. 3A is a schematic perspective view illustrating a shroud mounted on a droplet generator of an extreme ultraviolet light source device according to exemplary embodiments of the present inventive concepts.
Figure 3B:
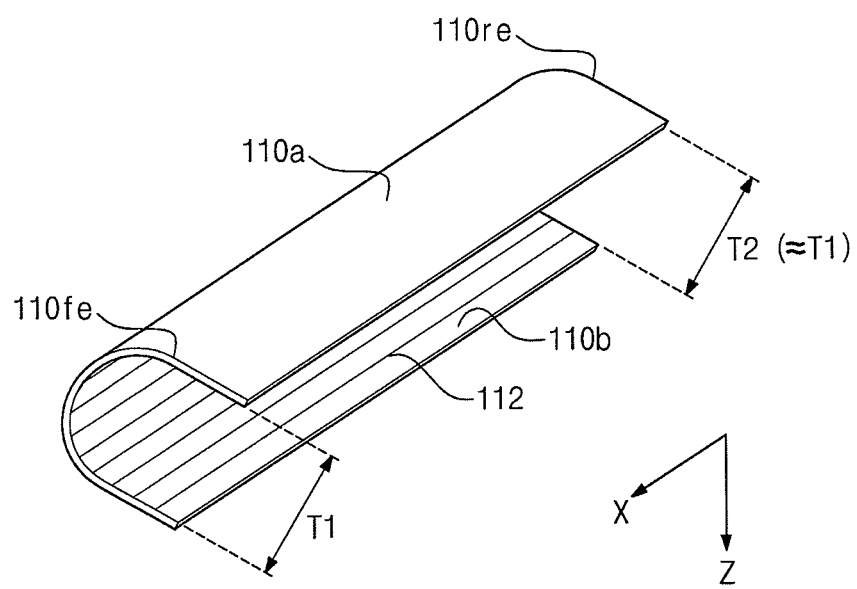
FIGS. 3B to 3D are schematic perspective views illustrating possible added features of the shroud of FIG. 3A.
Figure 3C:
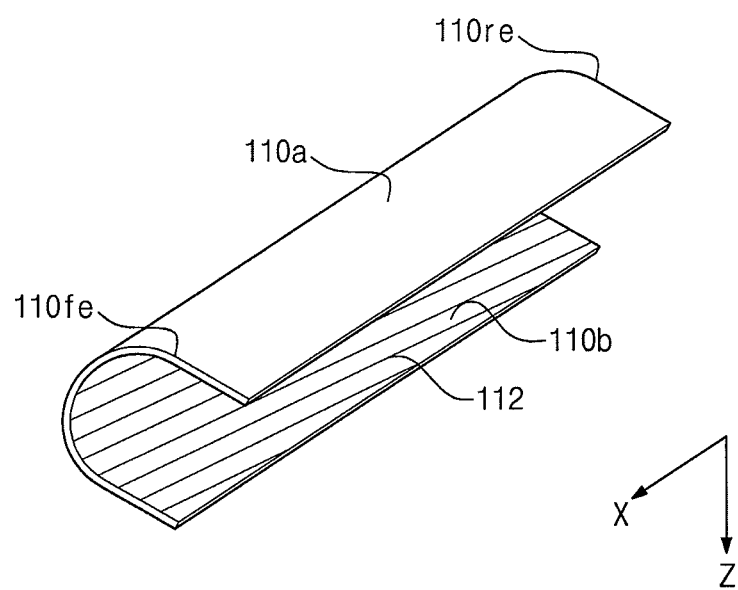
Figure 3D:
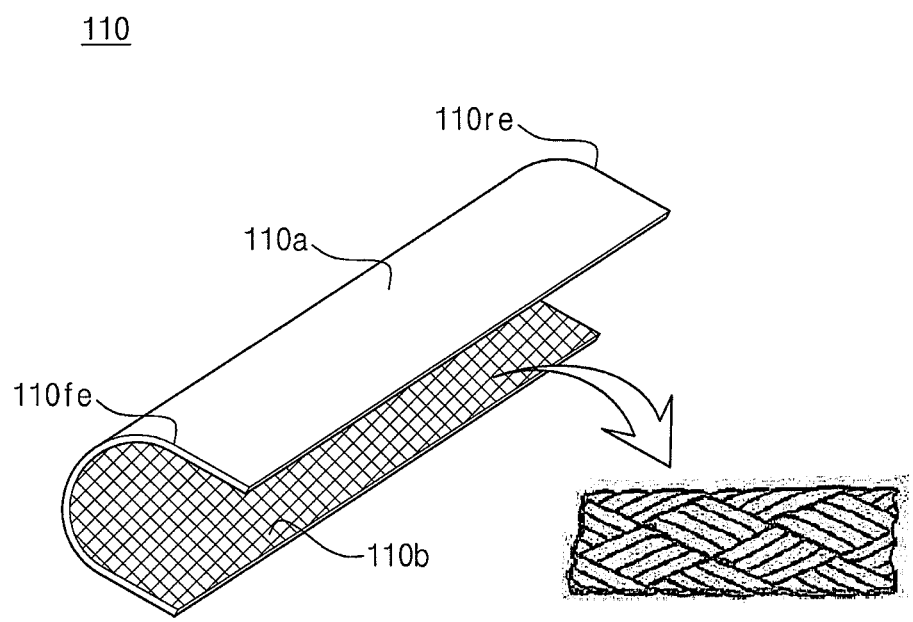

FIG. 3A is a schematic perspective view illustrating a shroud 110 mounted on a droplet generator 100 of an extreme ultraviolet light source device according to exemplary embodiments of the present inventive concepts. FIGS. 3B to 3D are schematic perspective views illustrating possible added features of the shroud 110.

Referring to FIG. 3A, the shroud 110 may have a shape suitable for shielding the droplet stream from the gas flow in the Y-axis direction. The shroud 110 may have a shape extending along at least a portion of the droplet stream in the X-axis direction and partially surrounding the droplet stream. Assuming the gas flows from the left to the right in the Y-axis direction in FIG. 3A, the shroud 110 may be shaped as a partial ring or cylinder, including a "U"-shaped cross-section having a closed left-hand (upstream) side, an open right-hand (downstream) side, and generally flat top and bottom sides. A rear end 110re of the shroud 110 may be coupled to the droplet generator 100, and a front end 110fe of the shroud 110 may face the droplet catcher (170 of FIG. 2).

The shroud 110 may experience accumulations of the target material, byproducts of the target material, and/or a superfluous target material from the droplet generator 100. These materials that accumulate on the shroud 110 may move to the collector mirror 90 such that the surface of collector mirror 90 may become contaminated with material and lose some of its effectiveness in reflecting the EUV light produced by the plasma. In some embodiments, the shroud 110 may have a structure capable of preventing the collector mirror 90 from becoming contaminated with the accumulated target or other material.

The shroud 110 may be shaped as a partial cylinder extending along an axis (e.g., the X-axis direction in FIG. 3A) from the front end 110fe to the rear end 110re, each end having the same size and height, as illustrated in FIG. 3B. Alternatively, the shroud 110 may be shaped as a partially truncated cone that tapers down in size from the rear end 110re to the front end 110fe, where each end has a different size and height, as illustrated in FIG. 4B.

Referring now to FIG. 3B, the shroud 110 may have a front end 110fe of a first height T1 and a rear end 110re of a second height T2, where height T2 is substantially identical to height T1. The shroud 110 may also have an inner surface 110b on which a flow guide 112 comprising a shroud surface feature is formed to guide accumulated target material away from collector mirror 90. The shroud 110 may have an outer surface 110a without surface features as seen in FIG. 3B. Alternatively, the shroud 110 may have an outer surface 110a that includes grooves in the X-axis direction similar to the inner surface 110b.

The flow guide 112 may be comprised of a set of recessed grooves (as seen in FIG. 3B) or as a set of ridges (not shown). For example, the flow guide 112 may comprise one or more grooves extending along the longitudinal direction (X-axis direction) of the shroud 110, i.e., the same as the direction of the droplet stream. Alternatively, the flow guide 112 may comprise one or more grooves or ridges extending obliquely or in a spiral or helical configuration along the longitudinal direction (X-axis direction) of the shroud 110. A set of obliquely-oriented flow guide grooves is illustrated in FIG. 3C.

The target material that accumulates on the shroud 110 may be confined within the flow guide 112 or may move along the flow guide 112. The shroud 110 may be positioned obliquely due to the tilting of the droplet generator 100. The front end 110fe may be positioned above the rear end 110re, so that accumulated target material may move toward the rear end 110re along flow paths defined by flow guide 112, and so that the container 120 (FIG. 3A) may receive the accumulated target material coming along the flow guide 112. This configuration of apparatus components may therefore reduce or prevent target material from accumulating on the collector mirror 90.

Referring next to FIG. 3D, the inner surface 100b of shroud 110 may alternatively have a braided structure. For example, the inner surface 110b of the shroud 110 may be shaped as a braiding pattern that provides increased surface area, so that extra target material may be easily absorbed. Alternatively, the outer surface 110a of the shroud 110 may also have a braided structure similar to inner surface 110b in FIG. 3D. If at least one of the inner surface 110b and the outer surface 110a has the braided structure, the container 120 may not be needed.

In some embodiments, at least one of the inner surface 110b and the outer surface 110a of shroud 110 may have a metallic braided structure identical to or similar to the solder wick disclosed in U.S. Pat. No. 3,627,191, which patent is incorporated herein by reference in its entirety. The solder wick may comprise Cu, and it may further comprise a flux for removing CuO on the Cu surface and for improving the surface wettability. To maintain chamber 80 in a clean condition, a solder wick in accordance with U.S. Pat. No. 3,627,191 containing the flux may be applied to the shroud 110.

Because the chamber 80 may be provided with a gas flow, and the solder wick can be heated by the laser beam 72, oxide (e.g., CuO) formed on the surface of the solder wick may thereby be removed. Therefore, a solder wick as described above may be used without the flux and thus be applied to the shroud 110.

Figure 4A:
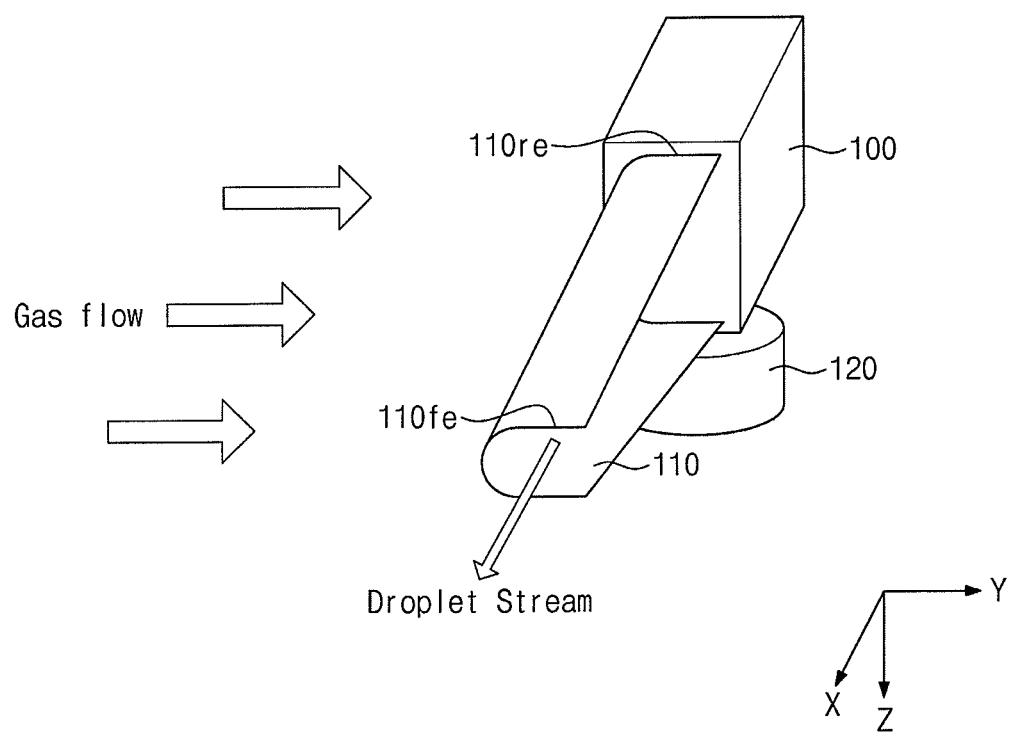
FIG. 4A is a schematic perspective view illustrating a shroud mounted on a droplet generator of an extreme ultraviolet light source device according to exemplary embodiments of the present inventive concepts.
Figure 4B:
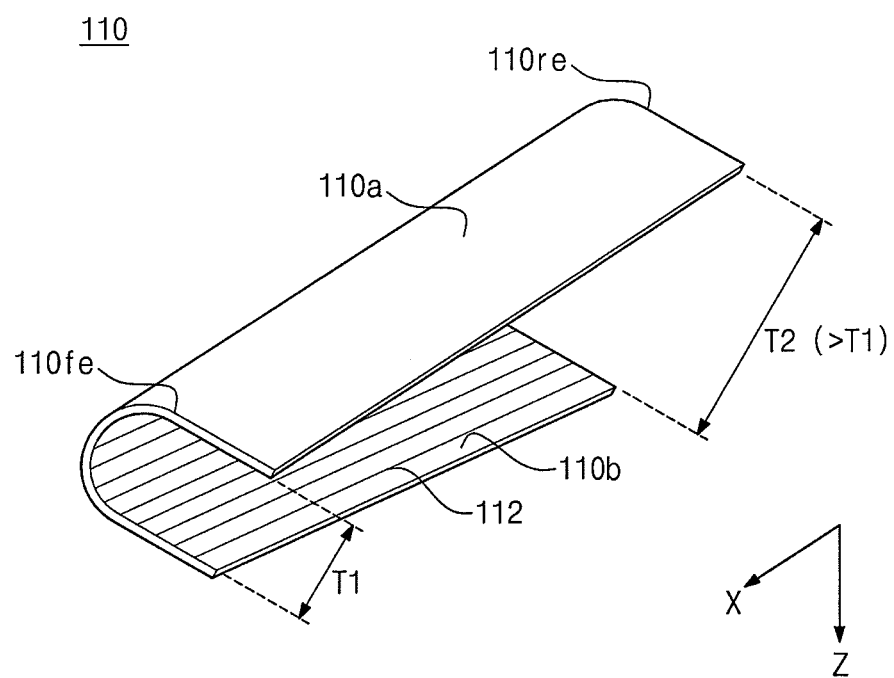
FIGS. 4B to 4D are schematic perspective views illustrating possible added features of the shroud of FIG. 4A.
Figure 4C:
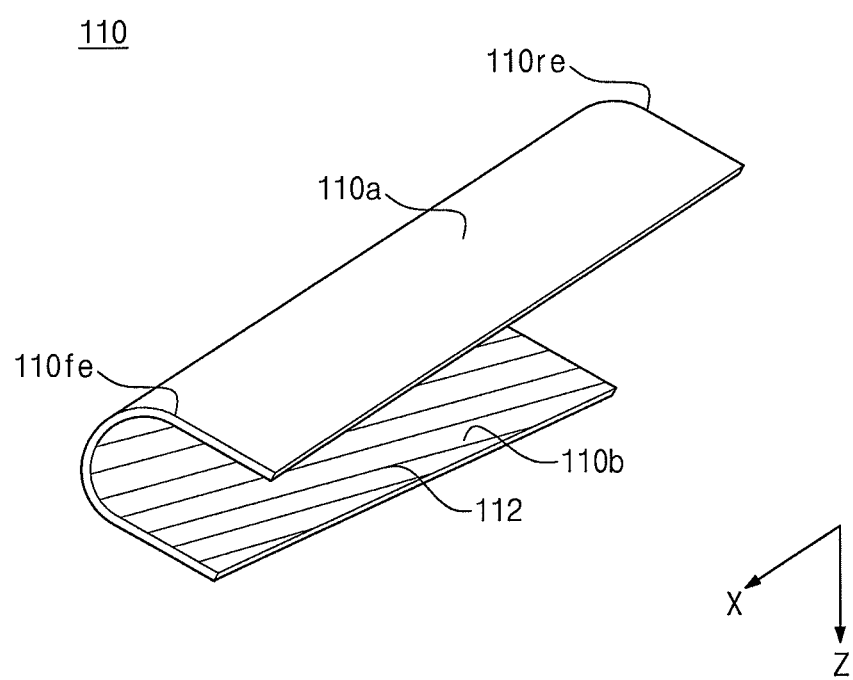
Figure 4D:
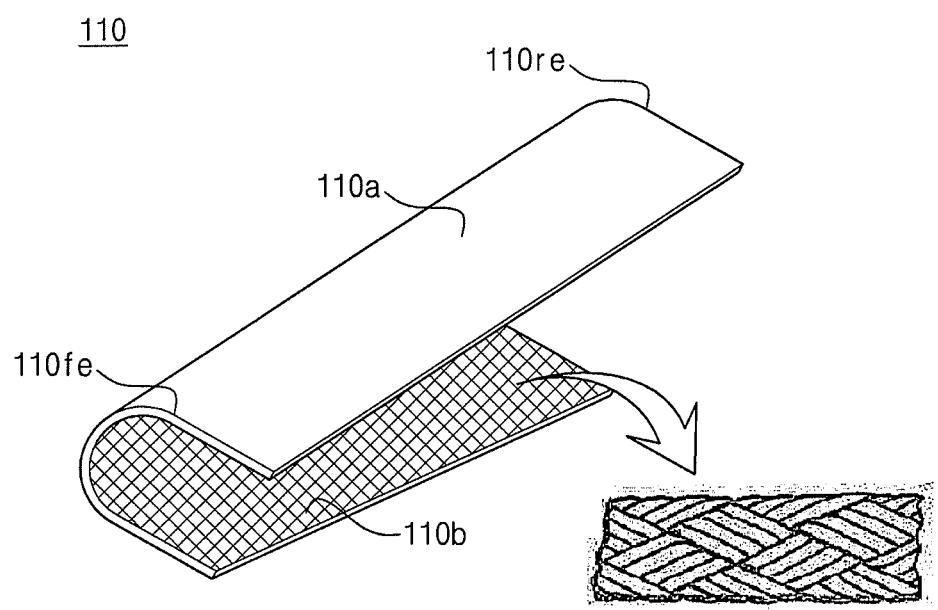

FIG. 4A is a schematic perspective view illustrating a shroud 110 mounted on a droplet generator 100 of an extreme ultraviolet light source device according to exemplary embodiments of the present inventive concepts. FIGS. 4B to 4D are schematic perspective views illustrating possible added features of the shroud 110.

Referring to FIG. 4A, the shroud 110 may have a "U" shape elongated along the direction of the droplet stream (X-axis direction) and be suitable for naturally moving accumulated target material along the direction of gravity (Z-axis direction).

Referring now to FIG. 4B, the shroud 110 may have a shape tapering down from the rear end 110re to the front end 110fe. For example, the shroud 110 may have a bottom side that inclines downward toward the rear end 110re in the direction of gravity (Z-axis direction). Therefore, the rear end 110re may have a second height T2 that is greater than the first height T1 of the front end 110fe. The flow guide 112 may comprise a set of grooves (or alternatively a set of ridges) extending along the longitudinal direction (X-axis direction) of the shroud 110. Alternatively, the flow guide 112 may comprise a set of grooves (or alternatively a set of ridges) extending obliquely or in a spiral or helical configuration along the longitudinal direction (X-axis direction) of the shroud 110. A set of obliquely-oriented flow guide grooves is illustrated in FIG. 4C.

Referring next to FIG. 4D, at least one of the inner surface 110b and the outer surface 110a may have a braided structure, as previously described with reference to FIG. 3D. In this case, the container 120 may not be needed.

Figure 5:
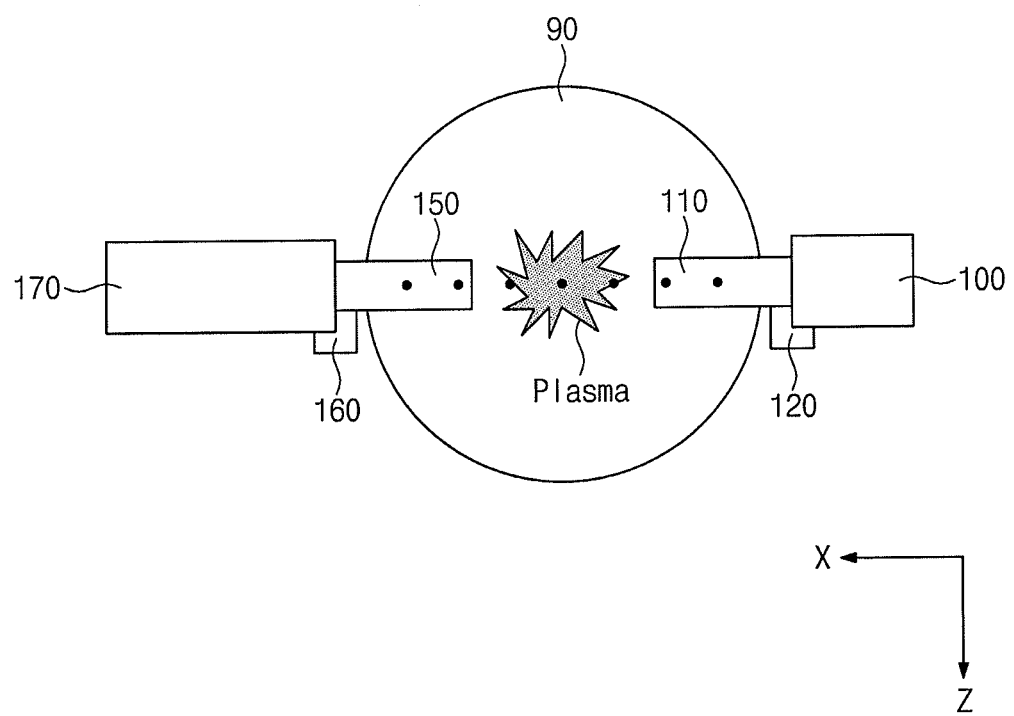
FIG. 5 is a modified version of the side view of FIG. 2.

FIG. 5 is a modified version of the side view of FIG. 2.

Referring to FIG. 5, the droplet catcher 170 may be provided with a second shroud 150 (in addition to the first shroud 110 which is associated with droplet generator 100). The second shroud 150 may be provided with a second container 160 which, similar to first container 120 associated with first shroud 110, may receive and store the target material that accumulates on second shroud 150. In this case, the stream of droplets of target material may have a decreased traveling path (i.e., the distance between the front end of shroud 110 and the front end of shroud 150) that is exposed to the collector mirror 90. The second shroud 150 may have any of the various shapes and/or configurations and/or surface features (such as flow guide features) previously described in this application.

Figure 6A:
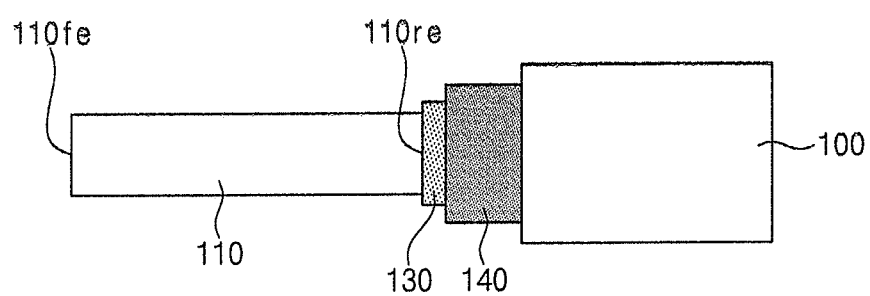
FIG. 6A is a schematic cross-sectional view illustrating a shroud mounted on a droplet generator of an extreme ultraviolet light source device according to exemplary embodiments of the present inventive concepts.
Figure 6B:
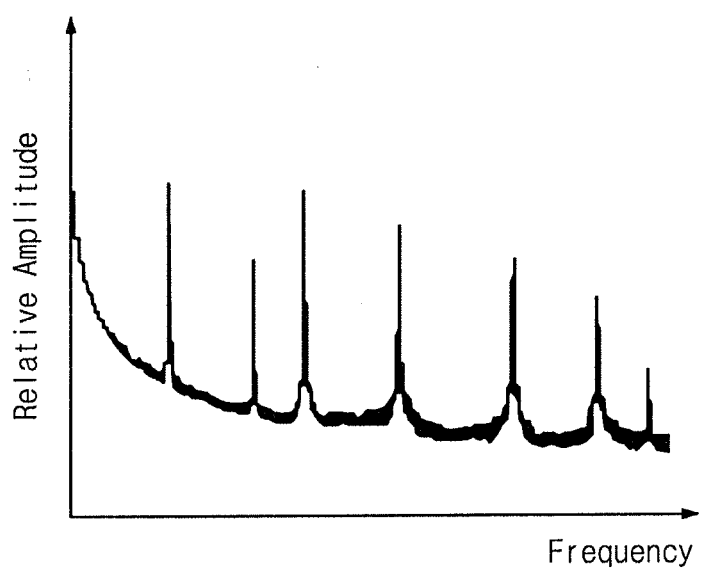
FIGS. 6B to 6D are graphs illustrating resonance frequencies of shrouds according to exemplary embodiments of the present inventive concepts.
Figure 6C:
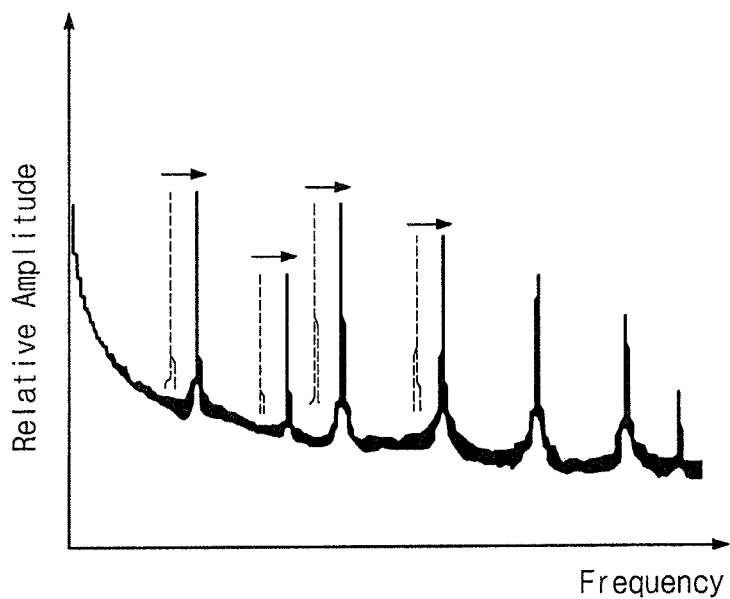
Figure 6D:
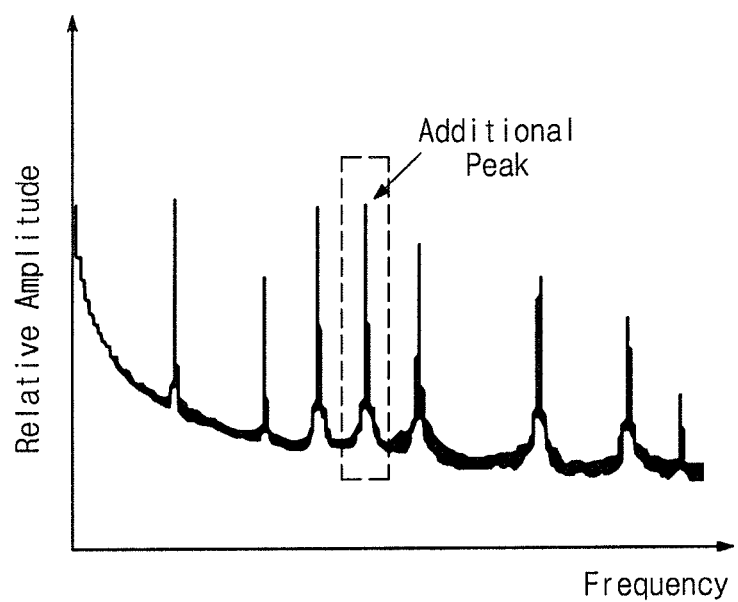

FIG. 6A is a schematic cross-sectional view illustrating a shroud 110 mounted on a droplet generator 100 of an extreme ultraviolet light source device according to exemplary embodiments of the present inventive concepts. FIGS. 6B to 6D are graphs illustrating resonance frequencies of shrouds according to exemplary embodiments of the present inventive concepts.

Referring to FIG. 6A, a piezoelectric transducer 140 may be further provided between the shroud 110 and the droplet generator 100. A resonance frequency of the shroud 110 may be changed according to the volume of the target material (e.g., Sn) that has accumulated on the shroud 110, and the piezoelectric transducer 140 may be used to measure the change of the shroud's resonance frequency. The chamber 80 (see FIG. 1) contains the plasma which is generated by the interaction of laser beam 72 with the droplet stream of target material. Chamber 80 is heated to a temperature equal to or greater than the melting point of the target material, which may give the chamber 80 a high temperature environment when the device 1 is in use. To help reduce or minimize the effect of that heat of operation on the piezoelectric transducer 140 and thereby to more reliably measure the accumulation of target material on the shroud 110, the shroud 110 may further be provided with a heat insulator 130 on the rear end 110re of the shroud 110, also as shown in FIG. 6A.

The accumulation of target material on the shroud 110 may be monitored by comparing a resonance frequency of the shroud 110 when target material is accumulated thereon, as illustrated in FIG. 6B, with a resonance frequency of the shroud 110 when no target material has accumulated thereon, as illustrated in FIG. 6C or 6D. If target material has accumulated on the shroud 110, the stiffness or mass of the shroud 110 may be changed, for example by making a shift of the resonance frequency toward the right (indicating a higher resonance frequency), as illustrated in FIG. 6C, or by forming an additional resonance frequency peak, as illustrated in FIG. 6D. From these changes, the variation of the resonance frequency may be used to determine whether the shroud 110 has an accumulation of target material.

One or both of the piezoelectric transducer 140 and the heat insulator 130 elements may be further provided on the second shroud 150 (FIG. 5), if present, coupled to the catcher 170 of FIG. 5.

Figure 7:
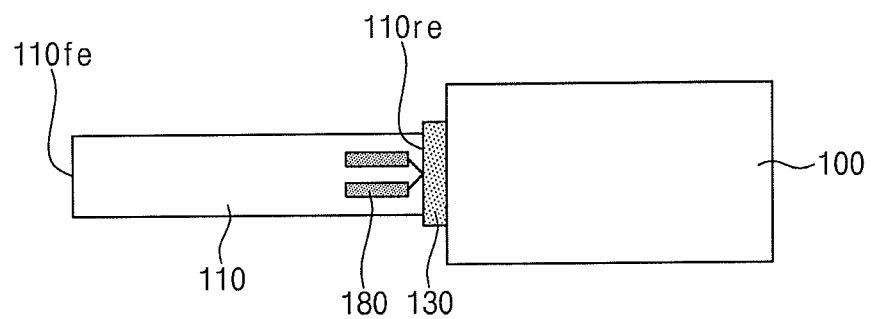
FIG. 7 is a schematic perspective view illustrating a shroud mounted on a droplet generator of an extreme ultraviolet light source device according to other exemplary embodiments of the present inventive concepts.

FIG. 7 is a schematic perspective view illustrating a shroud 110 mounted on a droplet generator 100 of an extreme ultraviolet light source device according to other exemplary embodiments of the present inventive concepts.

Referring to FIG. 7, a strain gauge 180 may be further provided on the rear end 110re of the shroud 110. An accumulation of target material on the shroud 110 may cause variations in the strain of the shroud 110, and the strain gauge 180 may be used to measure the strain and thereby to monitor the amount of target material that has accumulated on the shroud 110. Comparable to the embodiment of FIG. 6A, a heat insulator 130 may be further provided on the rear end 110re of the shroud 110 to reduce or minimize the effect of the heat of operation on strain gauge 180.

One or both of the strain gauge 180 and the heat insulator 130 elements may be further provided on the second shroud 150 (FIG. 5), if present, coupled to the droplet catcher 170 of FIG. 5.

According to embodiments of the present invention, a shroud element capable of guiding droplets of target material is coupled to the droplet generator and/or to the droplet catcher of an extreme ultraviolet light source device in order to reduce or prevent an accumulation of target material on the collector mirror. Consequently, the EUV apparatus of this invention has an increased lifespan and improved availability for use. Furthermore, it is possible to monitor the amount of target material that has accumulated on the shroud and thereby to better maintain the LPP apparatus prior to an accumulation of target material on the collector mirror, thereby improving operational efficiency.

Although the present invention has been described in connection with the embodiments of the present invention illustrated in the accompanying drawings, it is not limited thereto. It will be apparent to those skilled in the art that various substitutions, modifications and changes may be made thereto without departing from the scope and spirit of the invention.

What is claimed is:

1. An extreme ultraviolet light source device comprising:
a chamber in which a gas flow from an upstream side of the chamber to a downstream side of the chamber and a droplet stream of a target material are provided, and where the droplet stream is irradiated by laser to produce plasma that generates an extreme ultraviolet light that is reflected and focused by a collector mirror in the chamber;

a droplet generator through which a supply of target material is changed into the droplet stream; and a shroud positioned along the droplet stream, the shroud shielding at least a portion of the droplet stream from the gas flow, wherein the shroud has an inner surface that includes non-flat flow guide features that guide target material that may accumulate on the shroud away from the collector mirror and the non-flat flow guide features on the inner surface of the shroud comprise a set of grooves, or ridges, or a braided structure, wherein at least some portions of the non-flat flow guide features lie above or below the inner surface of the shroud.

2. The device of claim 1, wherein the shroud is coupled to the droplet generator, and the inner surface of the shroud comprises a set of non-flat elongated flow guide features oriented either toward the droplet generator or in a gravity direction, whereby accumulations of target material move along the flow guide features toward the droplet generator or in the gravity direction.

3. The device of claim 2, wherein the non-flat flow guide features extend linearly or in a spiral configuration along a longitudinal direction of the shroud.

4. The device of claim 2, wherein the shroud is configured with a "U"-shaped cross-section and positioned in the chamber such that a closed side of the "U" shape is on the upstream side of the chamber where it shields the droplet stream from the gas flow and an open side of the "U" is opposite from the closed side.

5. The device of claim 4, wherein the shroud includes a first end coupled to the droplet generator and a second end opposite the first end, and the open side of the shroud either has the same size at both ends or has a different size at each end with a tapering down from the larger first end to the smaller second end.

6. The device of claim 5, further comprising a container coupled to the first end of the shroud for receiving accumulated target material coming along the non-flat flow guide features.

7. The device of claim 1, further comprising a droplet catcher positioned along the droplet stream and configured to gather the droplet stream of target material.

8. The device of claim 7, further comprising a second shroud coupled to the droplet catcher and positioned along the droplet stream, wherein the second shroud has an inner surface that includes second-shroud flow guide features that comprise a set of elongated non-flat flow guide features oriented either toward the droplet catcher or in a gravity direction, whereby accumulations of target material move along the second-shroud flow guide features toward the droplet catcher or in the gravity direction.

9. The device of claim 8, further comprising a second container coupled to the second shroud for receiving accumulated target material coming along the non-flat second-shroud flow guide features.

10. An extreme ultraviolet light source device comprising:
a chamber having a collector mirror provided therein, the collector mirror receiving and reflecting an extreme ultraviolet light;
a droplet generator configured to provide the chamber with a droplet stream of target material;
a gas source configured to provide a gas flow across the droplet stream in a direction away from the collection mirror;
a laser system configured to produce a laser beam oriented to intersect droplets of target material to generate plasma and release extreme ultraviolet light; and
a first shroud coupled to the droplet generator, elongated along the direction of the droplet stream, and configured and oriented to shield a portion of the droplet stream,
wherein the first shroud has an inner surface that includes non-flat first-shroud flow guide features that guide target material that may accumulate on the first shroud toward the droplet generator;
a second shroud coupled to a droplet catcher,
wherein the second shroud has an inner surface that includes non-flat second-shroud flow guide features that guide target material that may accumulate on the second shroud toward the droplet catcher; and,
further comprising at least one of a piezoelectric transducer and a strain gauge coupled to at least one of the first and second shrouds.

11. The device of claim 10, wherein at least one of the first and second shrouds has a "U"-shaped cross-section with a closed side shielding the droplet stream from the gas flow and an open side opposite from the closed side, and the width of the open side tapers down from one end of the shroud to an opposite end of the shroud.

12. The device of claim 10, further comprising a heat insulator interposed between at least one of the first and second shrouds and at least one of the piezoelectric transducer and the strain gauge.

13. An extreme ultraviolet light (EUL) source apparatus comprising:
a plasma-generation chamber containing a collector mirror to reflect and focus EUL;
a source of a stream of droplets of a target material that traverses the chamber along a droplet path;
a source of a laser beam that traverses the chamber along a laser path that intersects the droplet path at an intersection location;
a source of a gas flow into, through and out of the chamber; and
at least a shroud that shields a portion of the stream of droplets from the gas flow and which includes surface features that inhibit accumulations of target material on shroud surfaces;
wherein the shroud includes surface features along one or both of its inner and outer surfaces that either absorb target material that may contact those surfaces and/or that are configured to guide that target material away from the intersection location,
and also wherein the surface features of the shroud comprise grooves and/or ridges that provide longitudinal channels along the surface(s) of the shroud.

14. An apparatus according to claim 13 wherein droplets along the droplet path are shielded from the gas flow both before and after the intersection location.

15. An apparatus according to claim 13 wherein the droplet path is shielded by the shroud from the gas flow along an upstream side relative to the gas flow direction, but is not shielded along a downstream side.

16. An apparatus according to claim 13 wherein the surface features extend linearly or in a spiral configuration along a longitudinal direction of the shroud along one or both of its inner and outer surfaces that either absorb target material that may contact those surfaces and/or that are configured to guide that target material away from the intersection location.

17. An apparatus according to claim 13 wherein the apparatus comprises a first shroud coupled to the source of a stream of droplets of the target material and a second shroud coupled to a droplet catcher.

\* \* \* \* \*